(12) United States Patent
Chen

(10) Patent No.: US 10,672,828 B2
(45) Date of Patent: Jun. 2, 2020

(54) LIGHT DETECTION DEVICE AND OPERATING METHOD THEREOF

(71) Applicant: InnoLux Corporation, Miao-Li County (TW)

(72) Inventor: Yu-Heing Chen, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 15/955,662

(22) Filed: Apr. 17, 2018

(65) Prior Publication Data

US 2018/0350868 A1    Dec. 6, 2018

(30) Foreign Application Priority Data

Jun. 1, 2017    (CN) .......................... 2017 1 0404793

(51) Int. Cl.
*H01L 27/146*    (2006.01)
*G01T 1/20*    (2006.01)
*H04N 5/32*    (2006.01)

(52) U.S. Cl.
CPC .......... *H01L 27/14663* (2013.01); *G01T 1/20* (2013.01); *G01T 1/2018* (2013.01); *H04N 5/32* (2013.01)

(58) Field of Classification Search
None
See application file for complete search history.

(56) References Cited

U.S. PATENT DOCUMENTS

| | | | |
|---|---|---|---|
| 7,777,167 B2 | 8/2010 | Takeda | |
| 7,989,772 B2 * | 8/2011 | Yagi ................. | H01L 27/14676 250/208.1 |
| 2011/0049371 A1 | 3/2011 | Kobayashi | |

FOREIGN PATENT DOCUMENTS

| | | |
|---|---|---|
| JP | 2015-118005 A | 6/2015 |
| WO | 2008/053978 A1 | 5/2008 |

* cited by examiner

*Primary Examiner* — Edwin C Gunberg
(74) *Attorney, Agent, or Firm* — Winston Hsu

(57) ABSTRACT

A light detection device and an operating method thereof are provided in the present disclosure. The light detection device includes a housing, a sensing substrate, a scintillator layer, and a light source module. The sensing substrate is disposed inside the housing. The scintillator layer is disposed inside the housing and disposed above the sensing substrate. The light source module is at least partially disposed inside the housing. The operating method of the light detection device includes the following steps. The light detection device is turned on and first image data is captured. The light source module is turned on and second image data is captured. The first image data is compared with the second image data for determining a condition of the light detection device.

9 Claims, 10 Drawing Sheets

LIGHT DETECTION DEVICE AND OPERATING METHOD THEREOF

BACKGROUND OF THE DISCLOSURE

1. Field of the Disclosure

The present disclosure relates to a light detection device and an operation method thereof, and more particularly, to a light detection device including a light source module and an operation method of the light detection device including a self-detection using the light source module.

2. Description of the Prior Art

Light sensing technology has been applied in many electronic products and detection equipment with the related development, and the light sensing technology capable of detecting X-ray is one of the applications that has received considerable attention. Because of properties such as low irradiation dose, fast electronic imaging, and convenience of viewing, copying, capturing, transferring, and analyzing electronic images, the traditional approach using films for detecting X-ray has been gradually replaced by the digital detection device, and the digital detection device has become the current trend of development of digital medical imaging. Photo diodes are generally used as light sensing units in the digital light detection device for detecting X-ray energy. However, when the light detection device is found to be abnormal after one X-ray irradiation to a human, there has to be a certain time interval between this X-ray irradiation and the next X-ray irradiation because X-rays have a certain degree of harm to humans and have a cumulative effect. It is inconvenient for the examinee and medical disputes may be generated accordingly.

SUMMARY OF THE DISCLOSURE

It is one of the objectives of the present disclosure to provide a light detection device and an operation method thereof. A light source module is disposed in the light detection device, and the light source module is used to perform a self-detection for determining whether the light detection device is normal or not. Detection errors generated by the abnormal light detection device and the related problems may be avoided accordingly.

A light detection device is provided in an embodiment of the present disclosure. The light detection device includes a housing, a sensing substrate, a scintillator layer, and a light source module. The sensing substrate is disposed inside the housing. The scintillator layer is disposed inside the housing and disposed above the sensing substrate. The light source module is at least partially disposed inside the housing.

An operating method of a light detection device is provided in another embodiment of the present disclosure. The operating method of the light detection device includes the following steps. A light detection device is provided. The light detection device includes a housing, a sensing substrate, a scintillator layer, and a light source module. The sensing substrate is disposed inside the housing. The scintillator layer is disposed inside the housing and disposed above the sensing substrate. The light source module is at least partially disposed inside the housing. The light detection device is turned on and first image data is captured. Subsequently, the light source module is turned on and second image data is captured. The first image data is compared with the second image data for determining a condition of the light detection device.

These and other objectives of the present disclosure will no doubt become obvious to those of ordinary skill in the art after reading the following detailed description of the embodiment that is illustrated in the various figures and drawings.

DETAILED DESCRIPTION

To provide a better understanding of the disclosure to the skilled person in the technical field of the disclosure, exemplary embodiments will be detailed as follows. The exemplary embodiments of the disclosure are illustrated in the accompanying drawings with numbered elements to elaborate the contents and effects to be achieved. The embodiments are only illustrative and are not intended to limit the scope of the present disclosure. Additionally, it can be understood that the terms "include", "comprise" and/or "have" used in the present disclosure may be used to point out the existence of the features, the regions, the steps, the operations, and/or the units, but the existence of one or more other features, regions, steps, operations, units, and/or the combination thereof is not excluded. It should be understood that when an element such as a layer or a region is referred to as being "on" or "extended to" another element (or a variation thereof), it can be directly on or directly extended to the other element, or intervening elements may be presented. In contrast, when an element is referred to as being "directly on" or "directly extended to" another element (or a variation thereof), there are no intervening elements. It should be understood that when an element is referred to as being "coupled with" another element (or a variation thereof), it can be directly coupled with another element or indirectly coupled with (such as electrically connected with) another element through one or more intervening elements.

Figure 1:
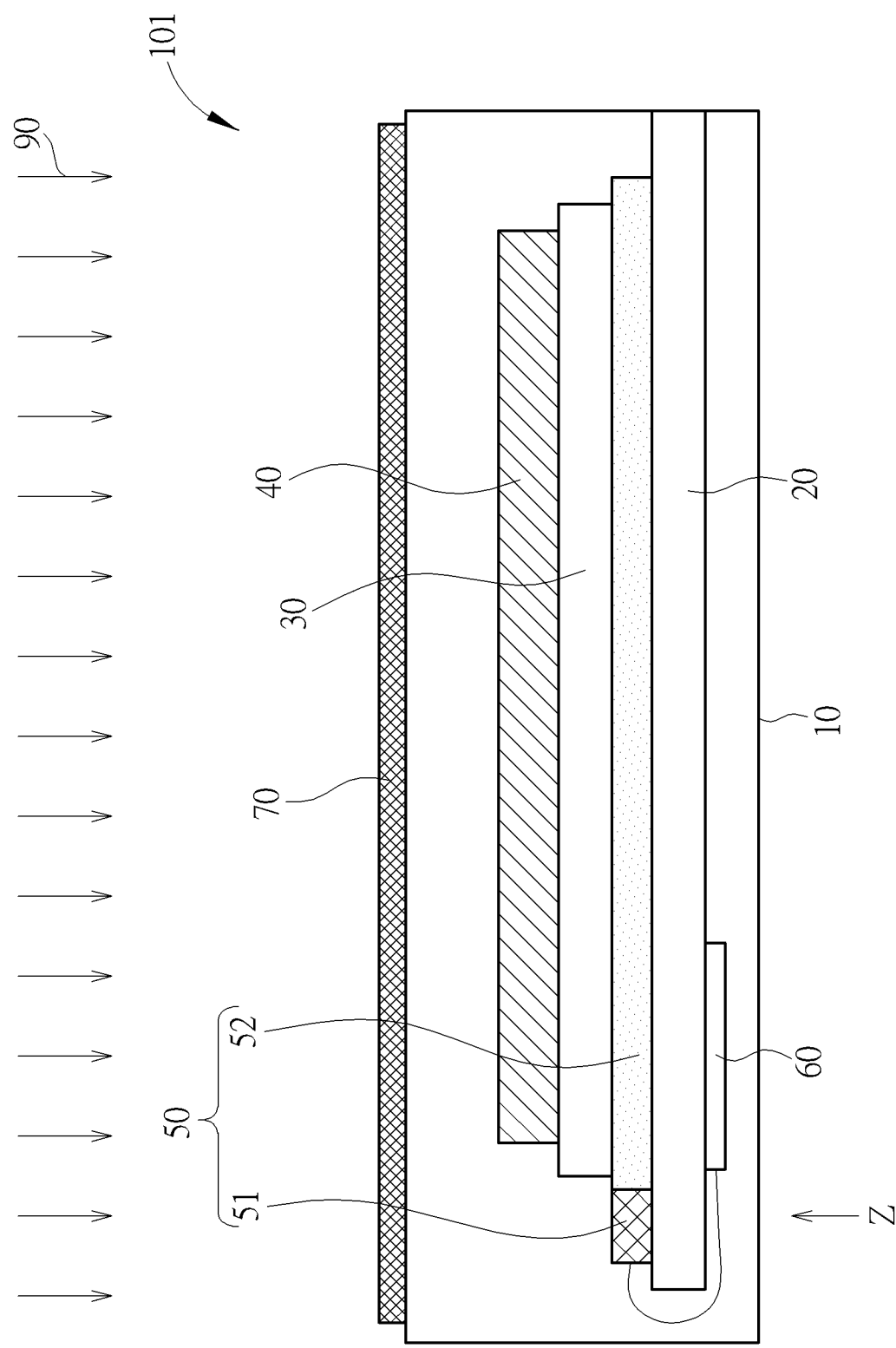
FIG. 1 is a cross-sectional schematic drawing illustrating a light detection device according to a first embodiment of the present disclosure.
Figure 2:
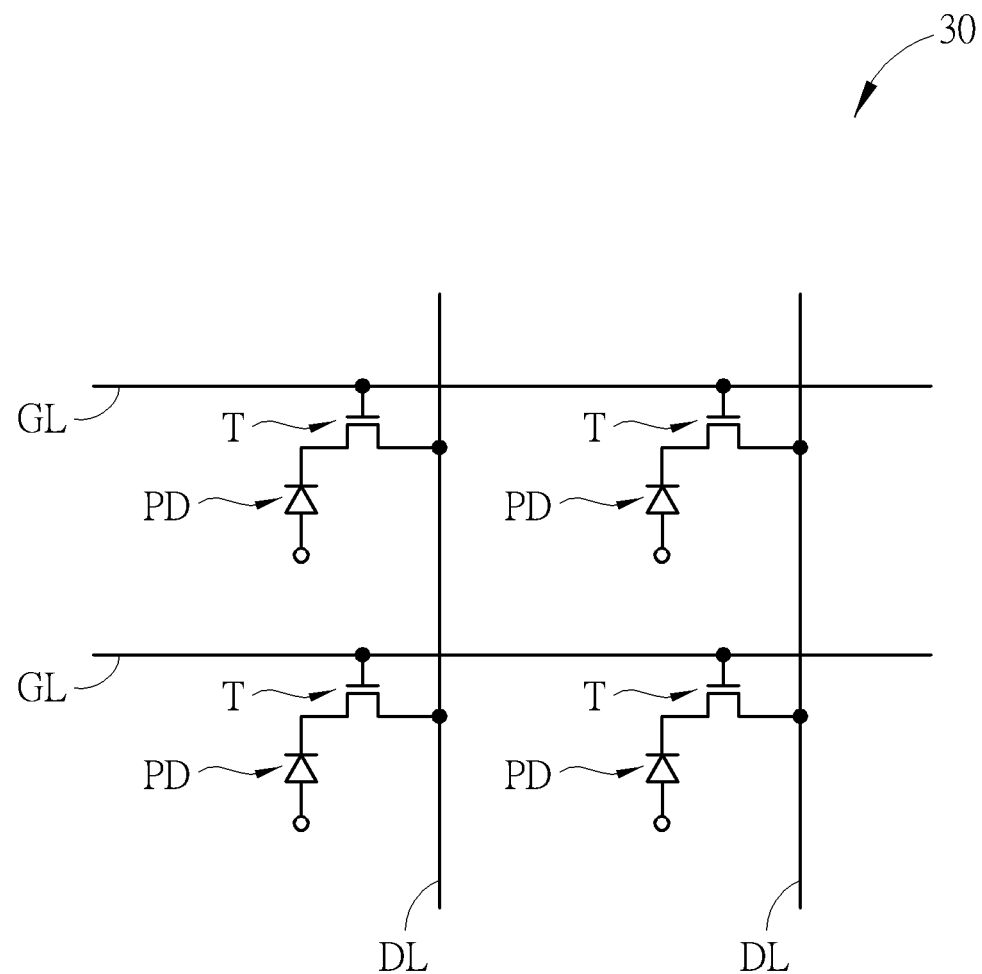
FIG. 2 is a schematic circuit diagram of a part of a sensing substrate according to the first embodiment of the present disclosure.

Please refer to FIG. 1 and FIG. 2. FIG. 1 is a cross-sectional schematic drawing illustrating a light detection device according to a first embodiment of the present disclosure, and FIG. 2 is a schematic circuit diagram of a part of a sensing substrate in this embodiment. As shown in FIG. 1, a light detection device 101 is provided in this embodiment. The light detection device 101 includes a housing 10, a sensing substrate 30, a scintillator layer 40, and a light source module 50. The sensing substrate 30 and the scintillator layer 40 are disposed inside the housing 10. The scintillator layer 40 is disposed above the sensing substrate 30, and the light source module 50 is at least partially disposed inside the housing 10. The portion of the light source module 50 disposed inside the housing has to be capable of emitting light. The light detection device 101 may be used to sense detection light 90 and generated corresponding image data, and the detection light 90 may include an X-ray or light within other suitable wavelength ranges, such as a gamma ray (γ ray). The light source module 50 is used to provide light to the sensing substrate 30 during a self-detection. Therefore, in some embodiments, the light source module 50 may be disposed completely inside the housing 10, or the light source module 50 may be partly disposed inside the housing 10 and provide light required in the self-detection. In some embodiments, the housing 10 may be made of an opaque material for blocking visible light or light within other wavelength range from entering the housing 10, but not limited thereto. In addition, the scintillator layer 40 is used to convert light within a specific wavelength range (such as an X-ray) into visible light, and the material of the scintillator layer 40 may include cesium iodide (CsI), but not limited thereto.

As shown in FIG. 1 and FIG. 2, in some embodiments, the sensing substrate 30 may include a plurality of switching units T and a plurality of light sensing units PD, and each of the light sensing units PD is electrically connected with at least one of the switching units T. For example, the sensing substrate 30 may include a plurality of data lines DL and a plurality of gate lines GL interlaced with one another for forming an array. Each of the switching units T may include a transistor electrically connected with a corresponding data line DL and a corresponding gate line GL, and the light sensing unit PD may include a photodiode coupled with a corresponding switching unit T. A semiconductor material in the transistor of the switching unit T may be low temperature poly-silicon (LTPS), indium gallium zinc oxide (IGZO), or amorphous silicon (a-Si), but not limited thereto. The switching condition of the switching unit T may be controlled via the gate line GL, a signal generated from the light sensing unit PD may be received via the data line DL when the corresponding switching unit T is turned on, and each of the light sensing units PD and the corresponding switching unit T may be regarded as one pixel, but not limited thereto. It is worth noting that the sensing substrate 30 in the light detection device of the present disclosure is not limited to the conditions described above, and other suitable kinds of sensing substrates may also be applied in the present disclosure.

As shown in FIG. 1, the light detection device 101 may further include a support substrate 20 disposed inside the housing 10, and the sensing substrate 30, the scintillator layer 40, and the light source module 50 may be disposed on the support substrate 20, but not limited thereto. Additionally, in some embodiments, the light source module 50 may be disposed under the sensing substrate 30, and the sensing substrate 30 may be disposed between the scintillator layer 40 and the light source module 50 in a top view (projective) direction Z perpendicular to the sensing substrate 30, but not limited thereto. In other words, the light source module 50 may be disposed between the support substrate 20 and the sensing substrate 30, and the scintillator layer 40 and the light source module 50 may be disposed at a top side and a bottom side of the sensing substrate 30 respectively in the top view direction Z. Accordingly, the light source module 50 may provide light to the sensing substrate 30 from the bottom side of the sensing substrate 30 for performing the self-detection. Additionally, in some embodiments, the light source module 50 may include an edge type light source module or a direct type light source module. For example, when the light source module 50 is an edge type light source module, the light source module 50 may include a light source 51 (such as a light emitting diode, LED or OLED) and a light guide plate 52 disposed adjacent to each other. Light generated by the light source 51 enters the light guide plate 52 from a light incident surface of the light guide plate 52 and are uniformly emitted from an illuminant surface facing the sensing substrate 30. A normal direction of the incident surface is perpendicular to the top view direction Z, and a normal direction of the illuminant surface is parallel with the top view direction Z. Additionally, the light source module 50 may be electrically connected to a circuit board 60 disposed at a back side of the support substrate 20, and the circuit board 60 may be used to control the switching condition and the light intensity of the light source module 50, but not limited thereto. In some embodiments, the light source module 50 may include a visible light source module configured to provide visible light irradiating the sensing substrate 30, but not limited thereto. In some embodiments, the wavelength range of the light emitted from the light source module 50 may be modified to be corresponding to the wavelength range of the light which can be inspected by the sensing substrate 30. For example, the light source module 50 may be an infrared light source module or a light source module within other suitable wavelength ranges. Additionally, in some embodiments, the light detection device 101 may further include a light filter layer 70 disposed above the scintillator layer 40. When the light detection device 101 is used to inspect X-rays, the visible light may be blocked by the light filter layer 70, and the X-rays (i.e. the detection light 90) may pass through the light filter layer 70, and the material of the light filter layer 70 may include carbon fiber, but not limited thereto. In some embodiments, the material of the housing 10 may be carbon fiber for blocking the visible light and permitting the X-rays to pass through, but the present disclosure is not limited to this and other appropriate materials may also be used to form the housing 10 and/or the light filter layer 70.

Figure 3:
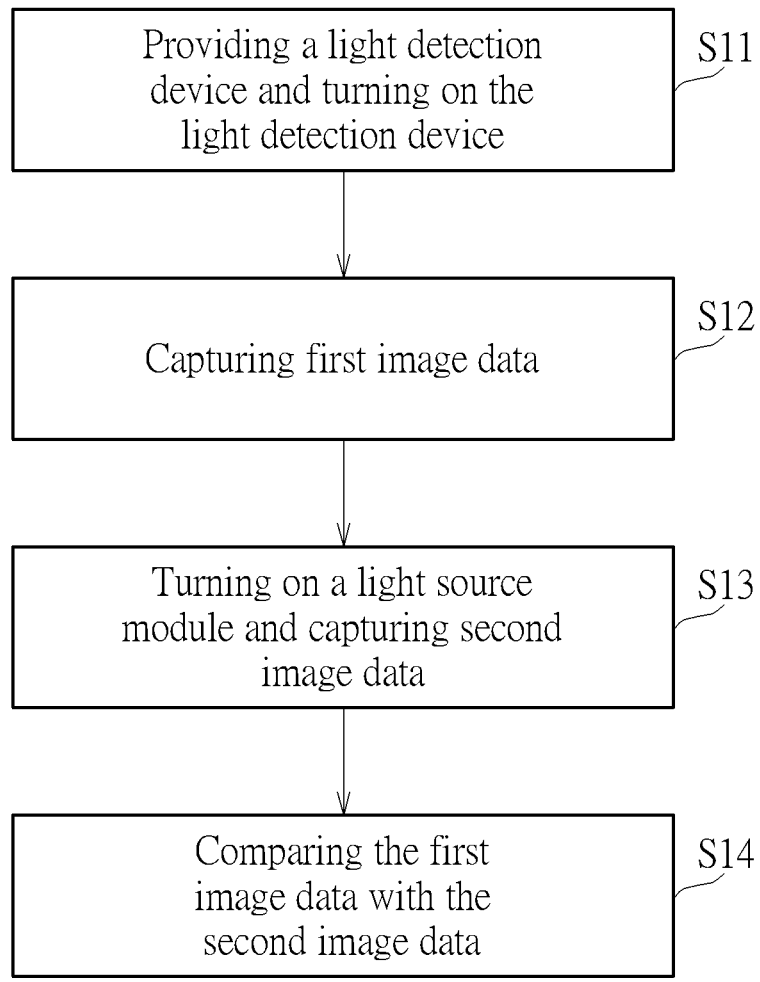
FIG. 3 is a flow chart of an operation method of the light detection device according to the first embodiment of the present disclosure.
Figure 4:
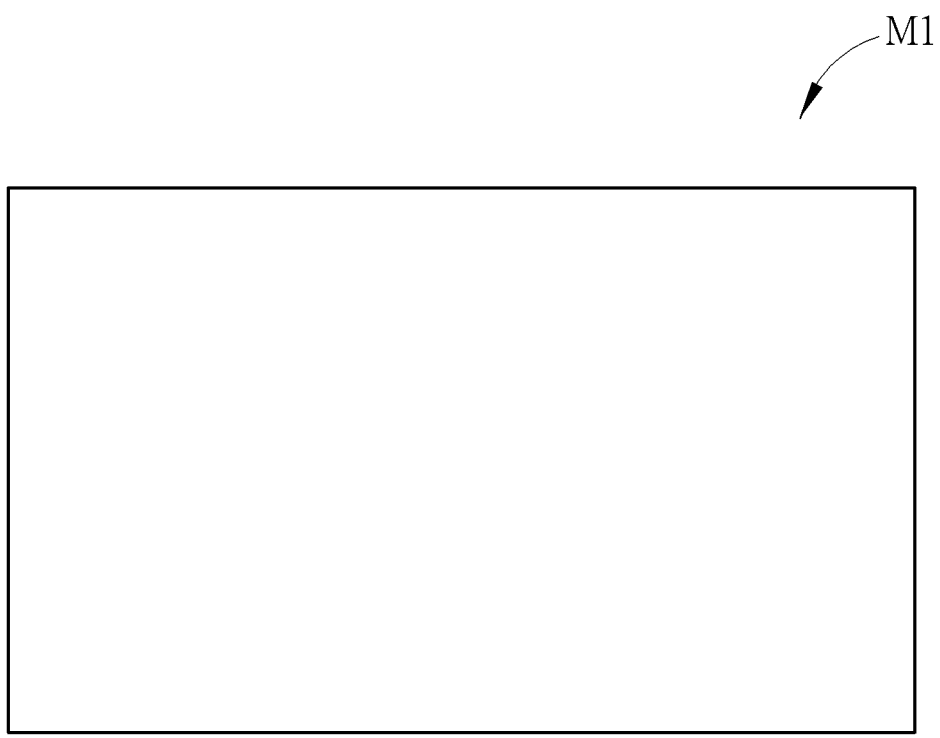
FIG. 4 is a schematic drawing illustrating first image data according to an embodiment of the present disclosure.
Figure 5:
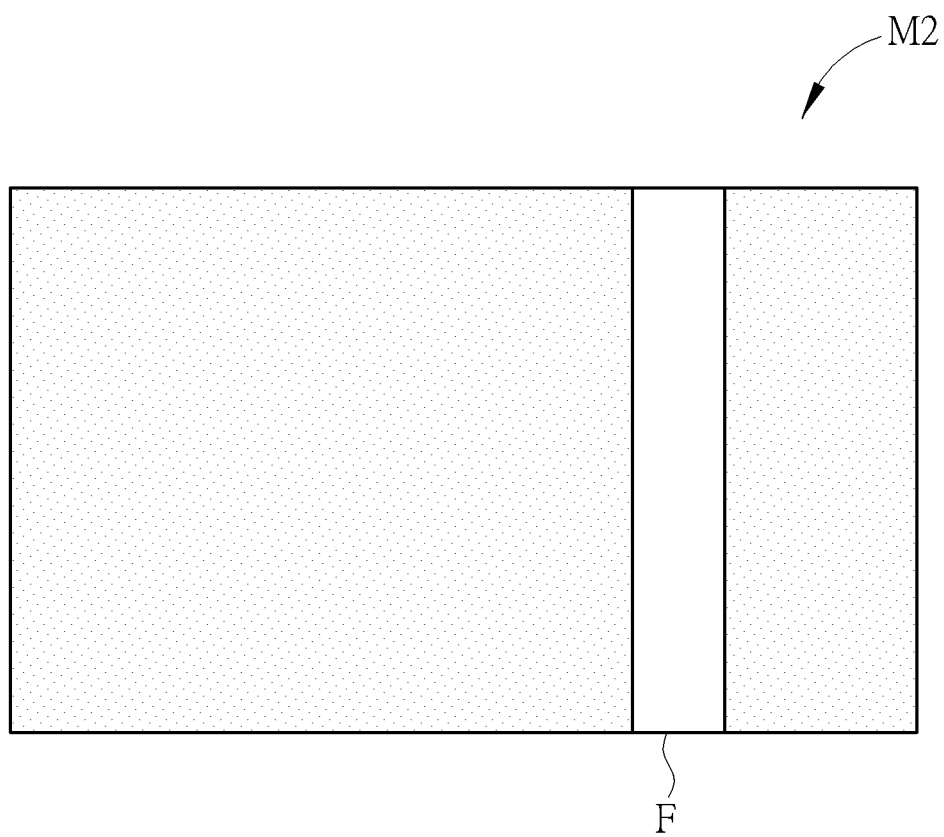
FIG. 5 is a schematic drawing illustrating second image data according to an embodiment of the present disclosure.

Please refer to FIGS. 3-5 and FIG. 1. FIG. 3 is a flow chart of an operation method of the light detection device 101 in this embodiment, FIG. 4 is a schematic drawing illustrating first image data according to an embodiment of the present disclosure, and FIG. 5 is a schematic drawing illustrating second image data according to an embodiment of the present disclosure. As shown in FIGS. 3-5 and FIG. 1, an operation method of the light detection device 101 is provided in this embodiment, and the operation method includes the following steps. Firstly, in step S11, the light detection device 101 is provided and the light detection device 101 is turned on. In step S12, first image data M1 is captured. Subsequently, in step S13, the light source module 50 is turned on, and second image data M2 is captured. In step S14, the first image data M1 is compared with the second image data M2 for determining a condition of the light detection device 101 and determining whether the condition of the light detection device 101 is normal or abnormal. Specifically, in step S11 and step S12, the sensing substrate 30 is turned on, and the light source module 50 is turned off. In other words, the first image data M1 is captured under the condition where the light source module 50 is turned off, and the first image data M1 may be regarded as a black screen image. Comparatively, in step S13, the second image data M2 is captured in the condition where the light source module 50 is turned on, and the second image data M2 is an image data obtained after the light emitted from the light source module 50 is received by the sensing substrate 30.

It is worth noting that the above-mentioned steps S11-S14 may be regarded as a self-detection flow performed on the light detection device 101 for confirming whether the light detection device 101 is normal before a step of performing a regular detection by the light detection device 101. Detection errors generated by the light detection device 101 in the regular detection when the light detection device is abnormal and other related problems may be avoided accordingly. Therefore, the light detection device 101 is not irradiated by the detection light 90 in the above-mentioned steps S11-S14, and the abnormal conditions described above may include abnormal conditions related to circuits and/or pixels in the sensing substrate 30 (such as a broken conductive line or a defective pixel), foreign bodies entering the housing 10, and other possible abnormal conditions. For example, by comparing the first image data M1 shown in FIG. 4 with the second image data M2 shown in FIG. 5, an abnormal region F may be observed in the second image data M2, and the abnormal region F may be generated by the abnormal conditions related to the circuits and/or the pixels in the sensing substrate 30. Therefore, the light detection device 101 may be determined to be abnormal by the condition of the second image data M2 shown in FIG. 5 and the regular X-ray detection cannot be performed by the light detection device 101. However, if the light intensity is uniform on the second image data M2 and there is not any abnormal region in the second image data M2 after comparing the second image data M2 with the first image data M1, the light detection device 101 may be determined to be normal and can be used to perform the X-ray detection, or the light detection device 101 may be determined to be abnormal and the detection should be terminated.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 6:
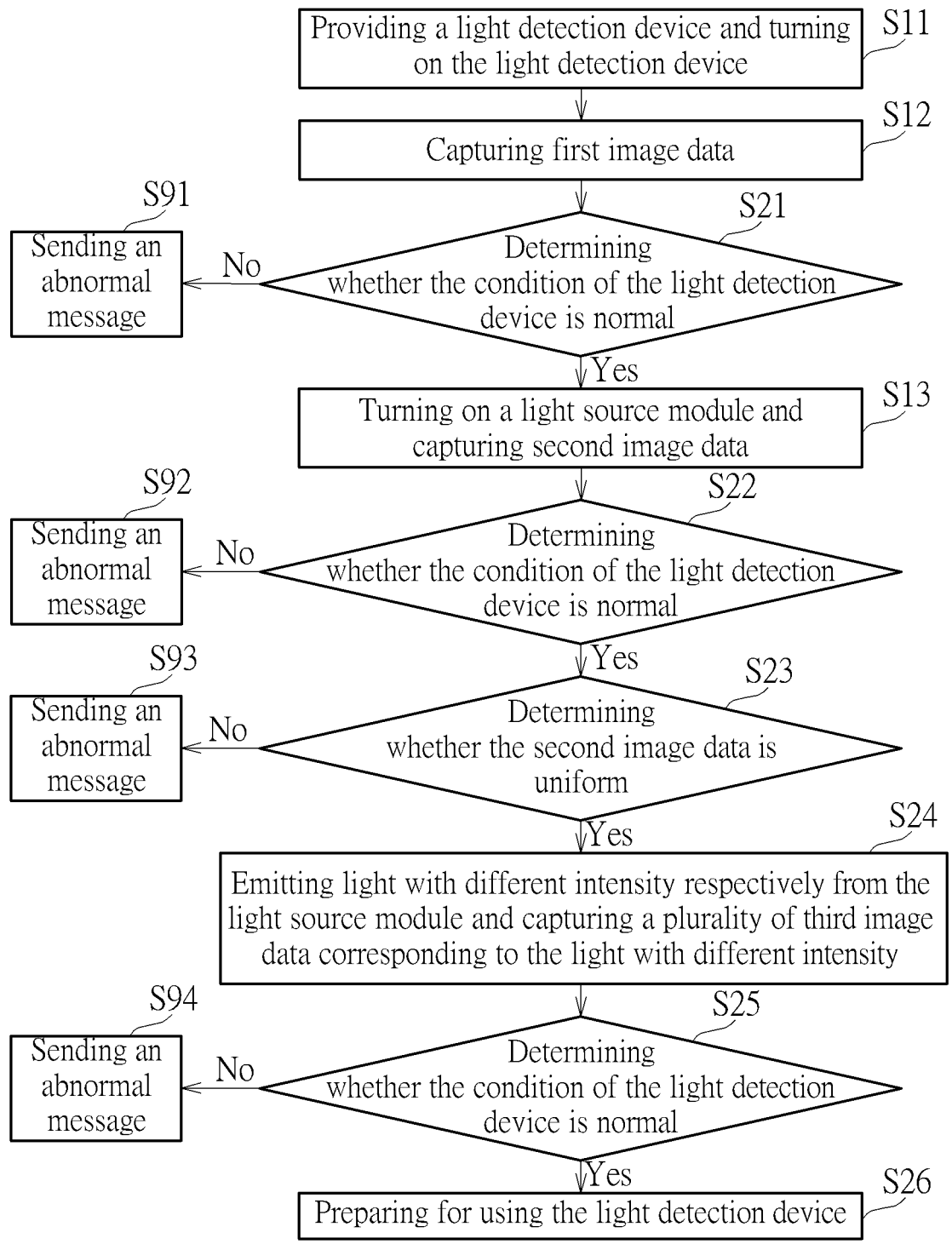
FIG. 6 is a flow chart of an operation method of a light detection device according to a second embodiment of the present disclosure.

Please refer to FIG. 6 and FIG. 1. FIG. 6 is a flow chart of an operation method of a light detection device according to a second embodiment of the present disclosure. As shown in FIG. 6 and FIG. 1, the difference between the operation method in this embodiment and the operation method in the first embodiment mentioned above is that the operation method of the light detection device in this embodiment may further include step S21 performed after the step S12 and before the step S13. In the step S21, the condition of the first image data may be used alone to determine whether the condition of the light detection device 101 is normal or abnormal. The intensity should be uniform on the first image data ideally because the first image data is captured under the condition where the light detection device is not irradiated by the detection light 90 and the light source module 50 is turned off. However, if the first image data is determined to be abnormal, such as there is a dot abnormal region, a linear abnormal region, or a bulk abnormal region on the first image data, the light detection device 101 may be determined to be abnormal and step S91 may be carried out to sending an abnormal message from the light detection device 101. The abnormal message may include a voice, an indication lamp, or text on a display panel for passing the abnormal information, but not limited thereto. In step S21, if the condition of the light detection device 101 is determined to be normal, step S13 may be carried out to turn on the light source module 50 and capture the second image data. Subsequently, step S22 is carried out to compare the first image data with the second image data for determining whether there is dot abnormal region, a linear abnormal region, or a bulk abnormal region and whether it is necessary to carry out step S92 for sending the abnormal message. Additionally, if the light detection device 101 is determined to be normal at the step S22, step S23 may be carried out to determine whether the second image data is uniform or not and confirm whether it is necessary to carry out step S93 for sending the abnormal message.

Figure 7:
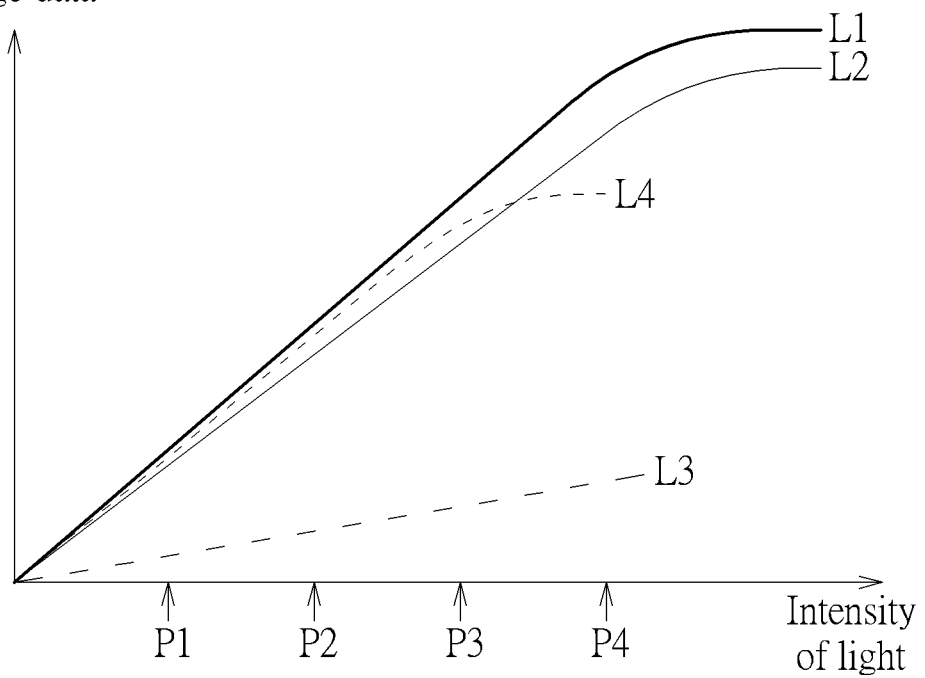
FIG. 7 is a schematic drawing illustrating a comparison between third image data captured respectively under light with different intensity emitted from a light source module according to the operation method of the light detection device in the second embodiment of the present disclosure.

Please refer to FIG. 6, FIG. 7, and FIG. 1. FIG. 7 is a schematic drawing illustrating a comparison between third image data captured respectively under light with different intensity emitted from the light source module 50 in the operation method of the light detection device according to this embodiment. As shown in FIG. 6, FIG. 7, and FIG. 1, if the second image data is determined to be uniform at the step S23, step S24 may be carried out to emit light with different intensity (or may be regarded as luminance) respectively from the light source module 50 and capture a plurality of third image data corresponding to the light with different intensity for determining whether the condition of the light detection device 101 is normal or abnormal in step S25. For instance, the light source module 50 may emit light with first intensity P1, light with second intensity P2, light with third intensity P3, and light with fourth intensity respectively, and a plurality of third image data may be captured corresponding to the light with different intensity. The third image data may be used to construct the distribution of the image data under light with different intensity. A first relation line L1 and a second relation line L2 shown in FIG. 7 may be regarded as normal performance of the pixels in the sensing substrate 30, and the corresponding image data may be saturated when the intensity of light is higher than an upper limit. It is worth noting that the intensity of the image data shown in FIG. 7 may be a difference between the third image data and the first image data mentioned above, and the corresponding image data may be generated by converting the voltage signals or the current signals obtained from the light sensing units (such as photodiodes) in the sensing substrate 30. Additionally, the voltage signals or the current signals obtained from the light sensing units (such as photodiodes) may be amplified by an amplifier for further processing, but not limited thereto. A third relation line L3 and a fourth relation line L4 shown in FIG. 7 may be relation lines generated from the third image data captured by different pixels in the sensing substrate 30 under the irradiation of the light with the first intensity P1, the light with second intensity P2, the light with the third intensity P3, and the light with the fourth intensity P4. Compared with the first relation line L1 and the second relation line L2 under the normal condition, the slope of the third relation line L3 is obviously smaller than the slope of the first relation line L1 and the slope of the second relation line L2, and the pixel corresponding to the third relation line L3 in the sensing substrate 30 may be determined to be abnormal. Additionally, compared with the first relation line L1 and the second relation line L2 under the normal condition, the fourth relation line L4 become saturated early, and it can be used to determine that the pixel corresponding to the fourth relation line L4 in the sensing substrate 30 is abnormal. If the relation line generated by calculating the third image data is determined to be abnormal in the step S25, step S94 may be carried out to send the abnormal message. Comparatively, if the relation line generated by calculating the third image data is determined to be normal in the step S25, step S26 may be carried out to prepare for using the light detection device 101. In other words, if the condition of the light detection device 101 is determined to be normal by the self-detection steps described above, the light detection device 101 may be used to perform the regular detection (such as the X-ray detection).

Figure 8:
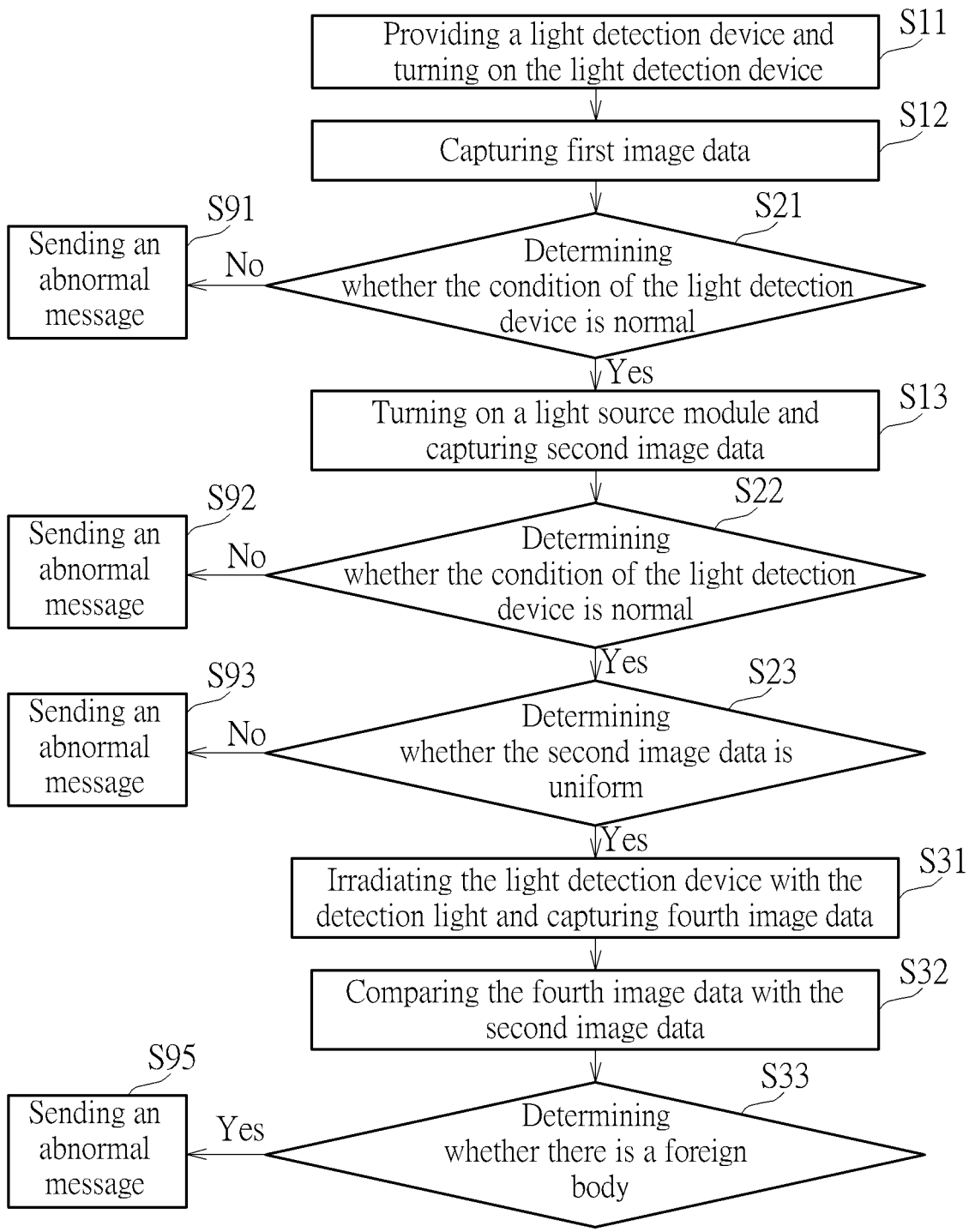
FIG. 8 is a flow chart of an operation method of a light detection device according to a third embodiment of the present disclosure.

Please refer to FIG. 8 and FIG. 1. FIG. 8 is a flow chart of an operation method of a light detection device according to a third embodiment of the present disclosure. As shown in FIG. 8 and FIG. 1, the difference between the operation method in this embodiment and the operation method in the second embodiment mentioned above is that the operation method of the light detection device in this embodiment may further include step S31 performed after the step S23 for irradiating the light detection device 101 with the detection light 90 and capturing fourth image data. Subsequently, in step S32, the fourth image data is compared with the second image data for determining whether there is a foreign body on the light detection device 101 and/or whether there is a foreign body in the light detection device 101 in step S33. If a foreign body is determined in the step S33, step S95 may be carried out to send the abnormal massage. Additionally, the result of the comparison between the fourth image data and the second image data may also be used to determine whether the material of the scintillator layer 40 is deteriorated for avoiding the influence of the material deterioration of the scintillator layer 40 on the detection results.

Figure 9:
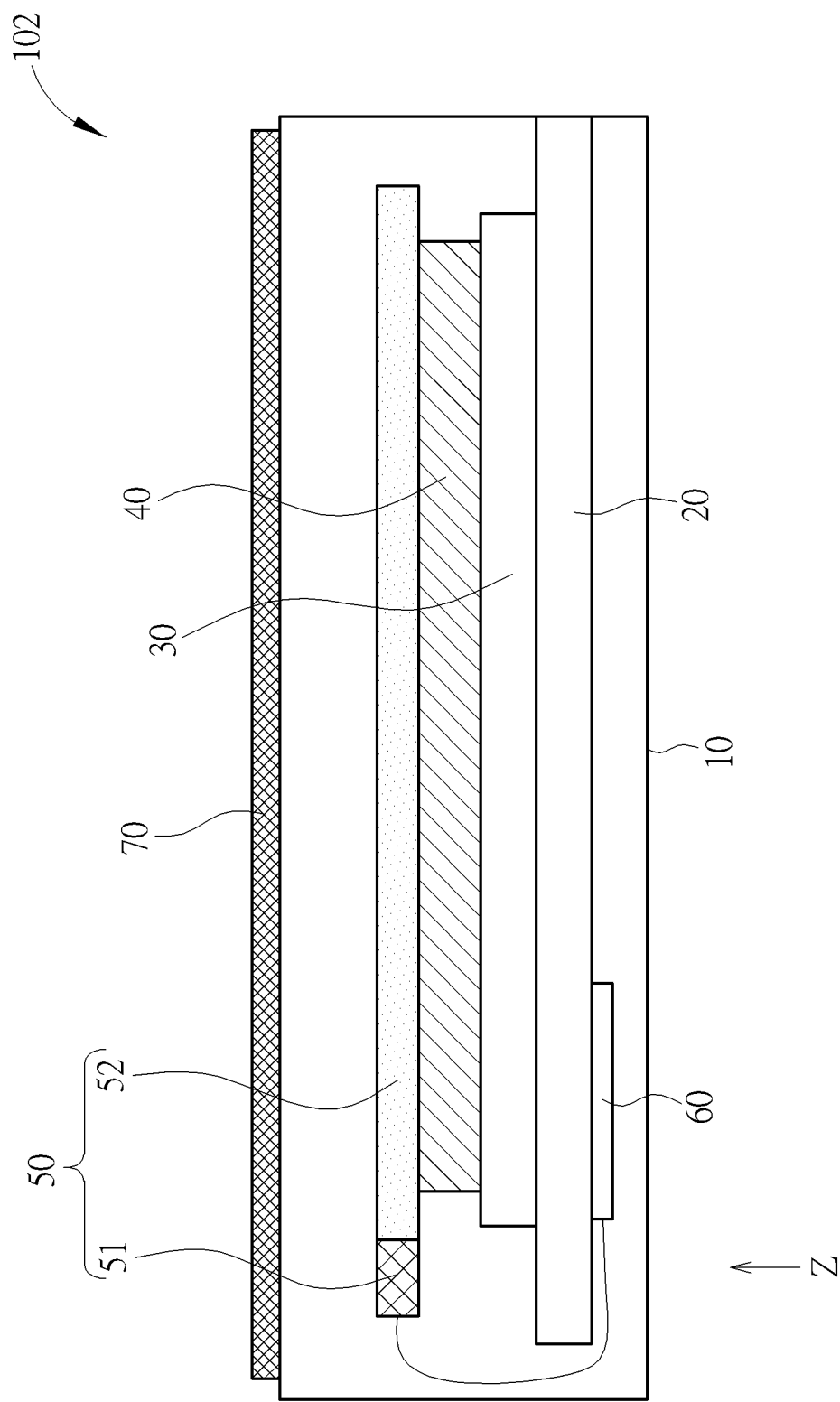
FIG. 9 is a cross-sectional schematic drawing illustrating a light detection device according to a fourth embodiment of the present disclosure.

Please refer to FIG. 9. FIG. 9 is a cross-sectional schematic drawing illustrating a light detection device 102 according to a fourth embodiment of the present disclosure. As shown in FIG. 9, the difference between the light detection device 102 and the light detection device in the first embodiment described above is that, in the light detection device 102, the light source module 50 may be disposed above the scintillator layer 40, and the scintillator layer 40 may be disposed between the light source module 50 and the sensing substrate 30. In other words, the light source module 50 may be disposed between the scintillator layer 40 and the light filter layer 70 in the top view direction Z, and the light source module 50 under this condition may be an edge type light source module for avoiding the influence on the regular light detection and the detection results thereof.

Figure 10:
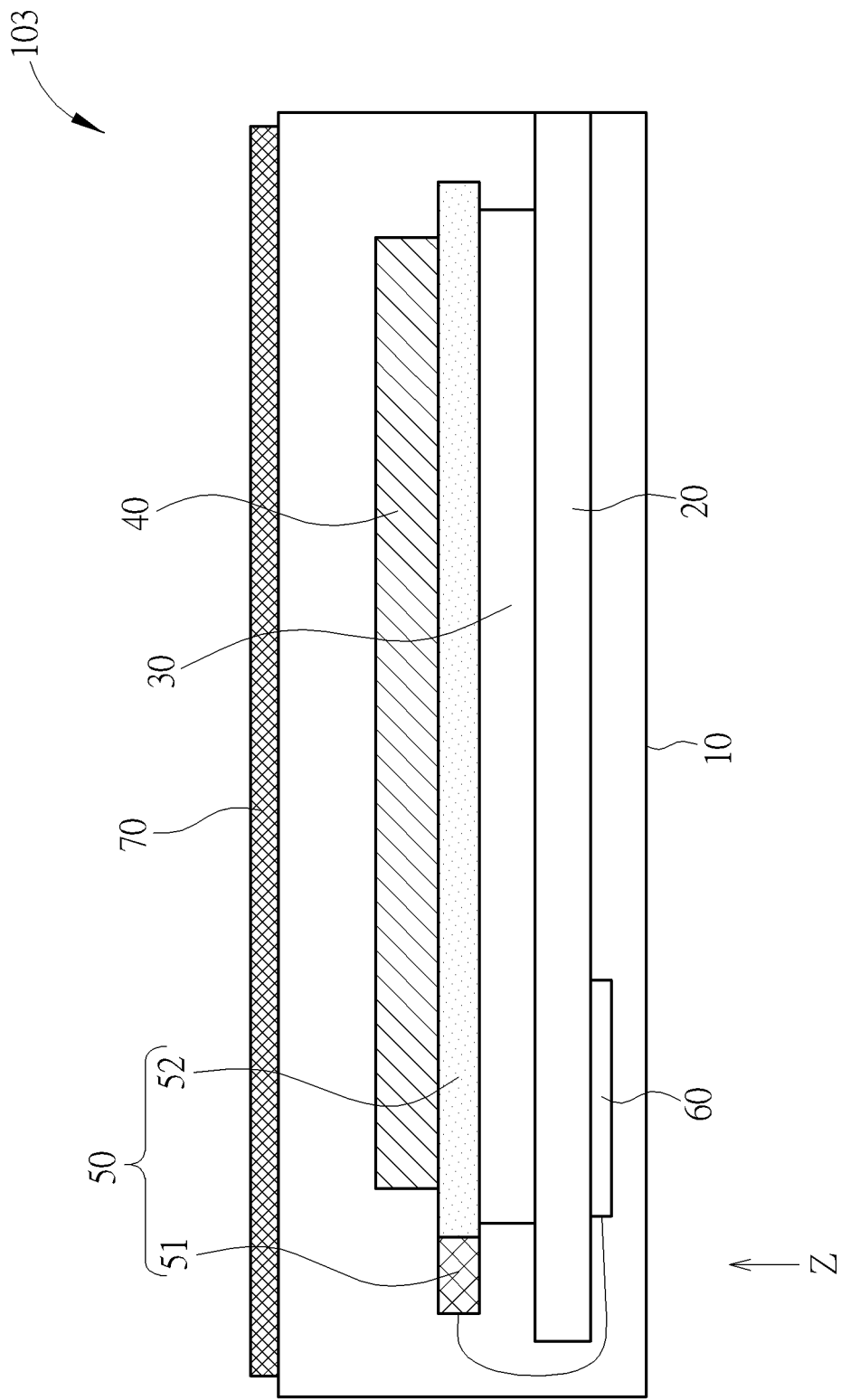
FIG. 10 is a cross-sectional schematic drawing illustrating a light detection device according to a fifth embodiment of the present disclosure.

Please refer to FIG. 10. FIG. 10 is a cross-sectional schematic drawing illustrating a light detection device 103 according to a fifth embodiment of the present disclosure.

As shown in FIG. 10, the difference between the light detection device 103 and the light detection device in the first embodiment described above is that, in the light detection device 103, the light source module 50 may be disposed between the scintillator layer 40 and the sensing substrate 30, and the light source module 50 under this condition may be an edge type light source module for avoiding the influence on the regular light detection and the detection results thereof.

It is worth noting that the allocation of the light source module in the light detection device of the present disclosure is not limited to the conditions of the embodiments described above. The light source module 50 may also be disposed at other position in the light detection device, such as a corner, a lateral side, or a bottom of the housing, or a part of the light source module 50 may be disposed outside the housing as long as the light provided by the light source module 50 can irradiate the sensing substrate 30.

To summarize the above description, in the light detection device and the operation method thereof according to the present disclosure, the light source module at least partially disposed inside the housing may be used to perform the self-detection for confirming whether the condition of the light detection device is normal or abnormal before performing the regular detection by the light detection device. The detection errors generated by the abnormal light detection device in the regular detection and the related problems may be avoided accordingly.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light detection device, comprising:
a housing;
a support substrate disposed inside the housing;
a sensing substrate disposed inside the housing and disposed above the support substrate;
a scintillator layer disposed inside the housing and disposed above the sensing substrate;
a circuit board disposed at a back side of the support substrate;
a light source module at least partially disposed inside the housing and electrically connected to the circuit board, wherein the circuit board and the light source module are disposed at two opposite sides of the support substrate respectively; and
a light filter layer disposed above the scintillator layer, wherein the light filter layer comprises carbon fiber.

2. The light detection device according to claim 1, wherein the light source module is disposed under the sensing substrate, and the sensing substrate is disposed between the scintillator layer and the light source module.

3. The light detection device according to claim 1, wherein the light source module is disposed above the scintillator layer, and the scintillator layer is disposed between the light source module and the sensing substrate.

4. The light detection device according to claim 1, wherein the light source module is disposed between the scintillator layer and the sensing substrate.

5. The light detection device according to claim 1, wherein the sensing substrate comprises a plurality of switching units and a plurality of light sensing units, and each of the light sensing units is electrically connected with at least one of the switching units.

6. An operating method of a light detection device, comprising:
providing a light detection device, the light detection device comprising:
a housing;
a support substrate disposed inside the housing;
a sensing substrate disposed inside the housing and disposed above the support substrate;
a scintillator layer disposed inside the housing and disposed above the sensing substrate;
a circuit board disposed at a back side of the support substrate; and a light source module at least partially disposed inside the housing and electrically connected to the circuit board, wherein the circuit board and the light source module are disposed at two opposite sides of the support substrate respectively;

turning on the sensing substrate, and turning off the light source module and capturing first image data, wherein the first image data is captured when the light source module is turned off;

turning on the light source module and capturing second image data, wherein the second image data is captured when the light source module is turned on; and comparing the first image data with the second image data for determining a condition of the light detection device.

7. The operating method of the light detection device according to claim 6, further comprising:

emitting light with different intensity respectively from the light source module and capturing a plurality of third image data corresponding to the light with different intensity for determining a condition of the light detection device.

8. The operating method of the light detection device according to claim 6, further comprising:

irradiating the light detection device with detection light and capturing fourth image data; and comparing the fourth image data with the second image data for determining whether there is a foreign body on the light detection device and/or whether there is a foreign body in the light detection device.

9. The operating method of the light detection device according to claim 8, wherein the detection light comprises an X-ray.

* * * * *